United States Patent
Chen et al.

(10) Patent No.: US 10,270,219 B1
(45) Date of Patent: Apr. 23, 2019

(54) PACKAGING STRUCTURE OF LASER DIODE

(71) Applicant: HIMAX TECHNOLOGIES LIMITED, Tainan (TW)

(72) Inventors: Kuan-Ming Chen, Tainan (TW); Shi-Jen Wu, Tainan (TW); Yin-Dong Lu, Tainan (TW)

(73) Assignee: Himax Technologies Limited, Tainan (TW)

( * ) Notice: Subject to any disclaimer, the term of this patent is extended or adjusted under 35 U.S.C. 154(b) by 0 days.

(21) Appl. No.: 15/894,896

(22) Filed: Feb. 12, 2018

(51) Int. Cl.
*H01S 5/022* (2006.01)
*H01S 5/042* (2006.01)

(52) U.S. Cl.
CPC ........ *H01S 5/02276* (2013.01); *H01S 5/0425* (2013.01)

(58) Field of Classification Search
CPC ........................... H01S 5/02276; H01S 5/0425
See application file for complete search history.

(56) References Cited

U.S. PATENT DOCUMENTS

| 2006/0054906 A1* | 3/2006 | Inoue | B82Y 20/00 257/89 |
| 2008/0205469 A1* | 8/2008 | Imai | H01S 5/0264 372/50.21 |

\* cited by examiner

*Primary Examiner* — Dung T Nguyen
(74) *Attorney, Agent, or Firm* — Wang Law Firm, Inc.

(57) ABSTRACT

A packaging structure of a laser diode is provided. The packaging structure of the laser diode includes a laser chip, a first substrate and a second substrate. The first substrate having a first electrode and a second electrode on a first surface of the first substrate, and the laser chip is disposed on the first surface of the first substrate; and a second substrate having a third electrode and a fourth electrode on a second surface of the second substrate, wherein the first electrode and the second electrode are electrically connected to the third electrode and the fourth electrode by a wireless-bonding process, respectively.

10 Claims, 6 Drawing Sheets

PACKAGING STRUCTURE OF LASER DIODE

BACKGROUND OF THE INVENTION

Field of the Invention

The present invention relates to a packaging structure of a laser diode, and more particularly to a packaging structure of a laser diode without a wire-bonding process.

Description of Related Art

With the development and progress of optical-electronic industry, laser diodes are a common product and are widely used due to their high power, fast transfer, and narrow bandwidth.

FIG. 1 is a packaging structure diagram of a laser diode in prior art. As show in FIG. 1, the well-known laser diodes are electrically connected to the outside through a bonding wire 50. Due to the wire bonding structure occupies more space, for example, the single electrode width of the wire bonding structure accounts for 100 micrometers, making the well-known laser diodes difficult to reduce in space. In addition, in the packaging of high-power laser diodes, the number of wires for a single electrode is more than one hundred at least, and the number of wires will make it impossible to verify that the electrical properties of each of the wires are compatible, so the quality cannot be guaranteed. Furthermore, after a period time of using, because there are more disconnected wires, then they cannot afford to high current loads, which led to laser diode damage.

Therefore, how to improve the effect of the wire bonding process on the package of the laser diode remains to be solved.

SUMMARY OF THE INVENTION

In view of the above-mentioned drawbacks of the prior art, the primary object of the present disclosure is to provide a packaging structure of a laser diode, through a wireless-bonding process to make electrodes connection, which is without disconnection doubts and effectively improving component reliability.

To achieve the above objectives, the present invention provides a packaging structure of a laser diode, the packaging structure of the laser diode includes: a laser chip, a first substrate and a second substrate. The first substrate having a first electrode and a second electrode on a first surface of the first substrate, and the laser chip is disposed on the first surface of the first substrate; and a second substrate having a third electrode and a fourth electrode on a second surface of the second substrate, wherein the first electrode and the second electrode are electrically connected to the third electrode and the fourth electrode by a wireless-bonding process, respectively.

Optionally, the first electrode and the second electrode are electrically connected to the third electrode and the fourth electrode by silver paste, respectively.

Optionally, the first electrode and the second electrode are electrically connected to the third electrode and the fourth electrode by solder, respectively.

Optionally, further comprising a third carrier having a fifth electrode and a sixth electrode on a third surface of the third carrier, and a seventh electrode and an eighth electrode on a fourth surface of the third carrier having, wherein the fifth electrode and the sixth electrode are electrically connected to the seventh electrode and the eighth electrode, respectively, wherein a ninth electrode and a tenth electrode on a fifth surface of the first carrier, and the first electrode and the second electrode are electrically connected to the ninth electrode and the tenth electrode through holes, respectively. The ninth electrode and the tenth electrode are electrically connected to the fifth electrode and the sixth electrode by silver paste or solder, respectively, and the seventh electrode and the eighth electrode are electrically connected to the third electrode and the fourth electrode by silver paste or solder, respectively.

Optionally, each of the holes is filled with a conductive material.

Optionally, the fifth electrode and the seventh electrode are integrally formed an L-shaped electrode, and the sixth electrode and the eighth electrode are integrally formed an L-shaped electrode.

Optionally, the first surface is opposite to the fifth surface.

Optionally, further comprising a third carrier disposed on a fifth surface of the first carrier for supporting the first carrier, wherein the first surface is opposite to the fifth surface Optionally, further comprising a third carrier having a fifth electrode and a sixth electrode on a third surface of the third carrier, and a seventh electrode and an eighth electrode on a fourth surface of the third carrier having, wherein the fifth electrode and the sixth electrode are electrically connected to the seventh electrode and the eighth electrode, respectively, wherein the first electrode and the second electrode of the first carrier are electrically connected to the fifth electrode and the sixth electrode by silver paste or solder, respectively, and the seventh electrode and the eighth electrode are electrically connected to the third electrode and the fourth electrode by silver paste or solder, respectively.

Optionally, the fifth electrode and the seventh electrode are integrally formed an L-shaped electrode, and the sixth electrode and the eighth electrode are integrally formed an L-shaped electrode.

In the light of the above, according to the present invention it may have one or more of the following advantages:

1. The electrodes are electrically connected to each other by silver paste so that the first electrode and the second electrode on the first surface of the first carrier are respectively electrically connected to the third electrode and the fourth electrode on the second surface of the second carrier by the wireless-bonding process, which is without disconnection doubts, effectively improving the component reliability and reducing the packaging space.

2. The electrodes are electrically connected to each other by solder so that the first electrode and the second electrode on the first surface of the first carrier are respectively electrically connected to the third electrode and the fourth electrode on the second surface of the second carrier by the wireless-bonding process, which is without disconnection doubts, effectively improving the component reliability and reducing the packaging space.

3. By means of hole, the electrodes are electrically connected to each other by the wireless-bonding process, which is without disconnection doubts, effectively improving the component reliability and reducing the packaging space.

4. The third carrier is used to support the first carrier.

With these and other objects, advantages, and features of the invention that may become hereinafter apparent, the nature of the invention may be more clearly understood by reference to the detailed description of the invention, the embodiments and to the several drawings herein.

BRIEF DESCRIPTION OF THE DRAWINGS

The exemplary embodiment(s) of the present invention will be understood more fully from the detailed description given below and from the accompanying drawings of various embodiments of the invention, which, however, should not be taken to limit the invention to the specific embodiments, but are for explanation and understanding only.

DESCRIPTION OF THE PREFERRED EMBODIMENTS

Exemplary embodiments of the present invention are described herein in the context of a packaging structure of a laser diode.

Those of ordinary skilled in the art will realize that the following detailed description of the exemplary embodiment(s) is illustrative only and is not intended to be in any way limiting. Other embodiments will readily suggest themselves to such skilled persons having the benefit of this disclosure. Reference will now be made in detail to implementations of the exemplary embodiment(s) as illustrated in the accompanying drawings. The same reference indicators will be used throughout the drawings and the following detailed description to refer to the same or like parts.

Figure 1:
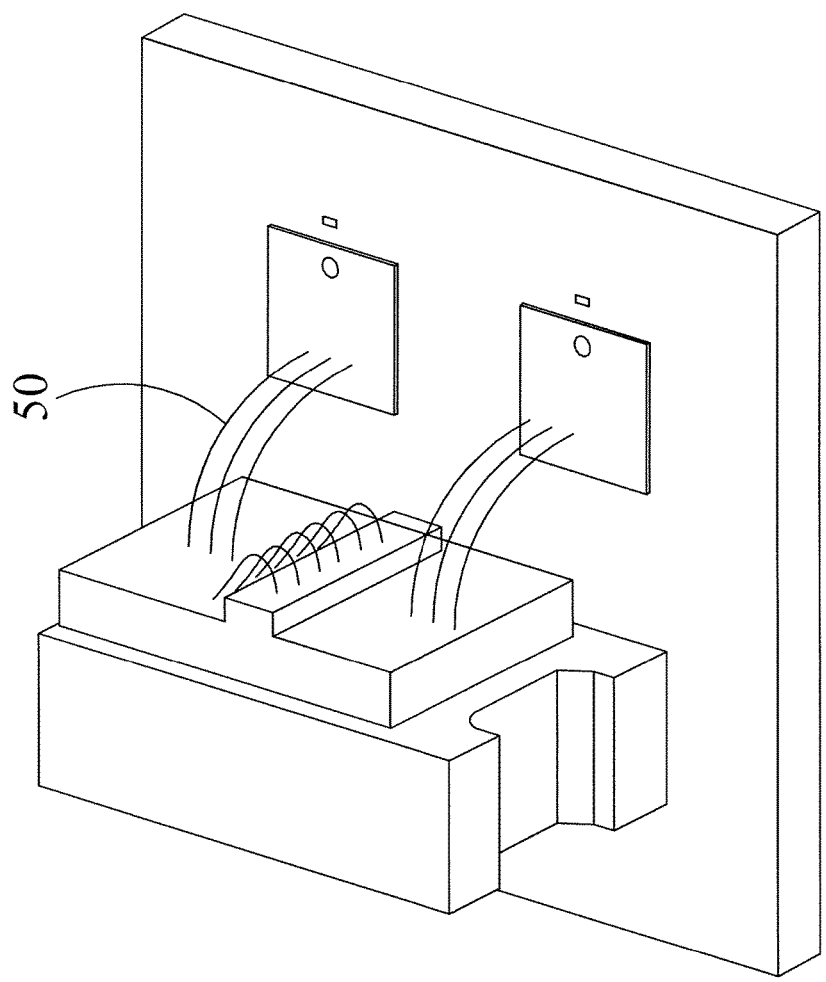
FIG. 1 is a packaging structure diagram of a laser diode in prior art.
Figure 2:
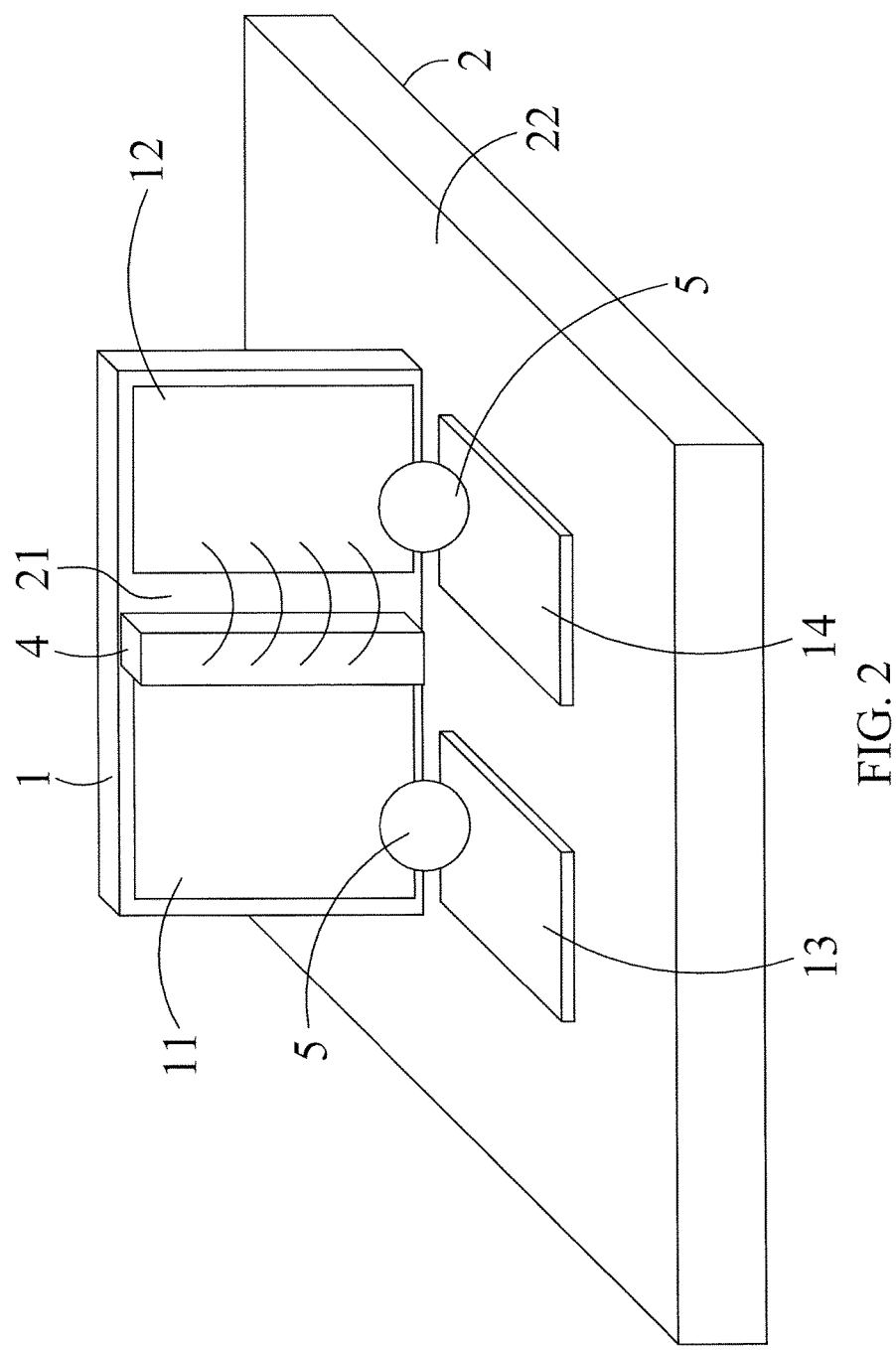
FIG. 2 is a packaging structure diagram of a laser diode in accordance with an embodiment of the present invention.

FIG. 2 is a packaging structure diagram of a laser diode in accordance with an embodiment of the present invention. Please refer to FIG. 2, the packaging structure of the laser diode includes: a laser chip 4, a first substrate 1 and a second substrate 2. The laser chip 4 may be a laser diode light-emitting element. There are a first electrode 11 and a second electrode 12 on a first surface 21 of the first substrate 1, and the laser chip 4 is disposed on the first surface 21 of the first substrate 1. The laser chip 4 may be electrically connected to the second electrode 12 of the first carrier 1 by silver paste, solder or the only once wire bonding. In addition, there are a third electrode 13 and a fourth electrode 14 on a second surface 22 of the second substrate 2, and the first carrier 1 is disposed on the second surface 22 of the second carrier 2. The first electrode 11 and the second electrode 12 are electrically connected to the third electrode 13 and the fourth electrode 14 by a wireless-bonding process, respectively. For example, the first electrode 11 and the second electrode 12 are directly electrically connected to the third electrode 13 and the fourth electrode 14 by silver paste 5, respectively, or the first electrode 11 and the second electrode 12 are directly electrically connected to the third electrode 13 and the fourth electrode 14 by solder 5, respectively. Specifically, the electrodes of the present invention are made of conductive metallic materials, such as copper, nickel, gold, silver, or other alloys, and the substrates of the present invention are made of insulation materials, such as resin, glass or ceramic.

In the above, the electrodes are electrically connected to each other by silver paste or solder 5, so that the first electrode 11 and the second electrode 12 of the first surface 21 of the first substrate 1 are respectively electrically connected to the third electrode 13 and the fourth electrode 14 of the second surface 22 of the second carrier 2 by the wireless-bonding process, which is without disconnection doubts, effectively improving the component reliability and reducing the packaging space.

Figure 3:
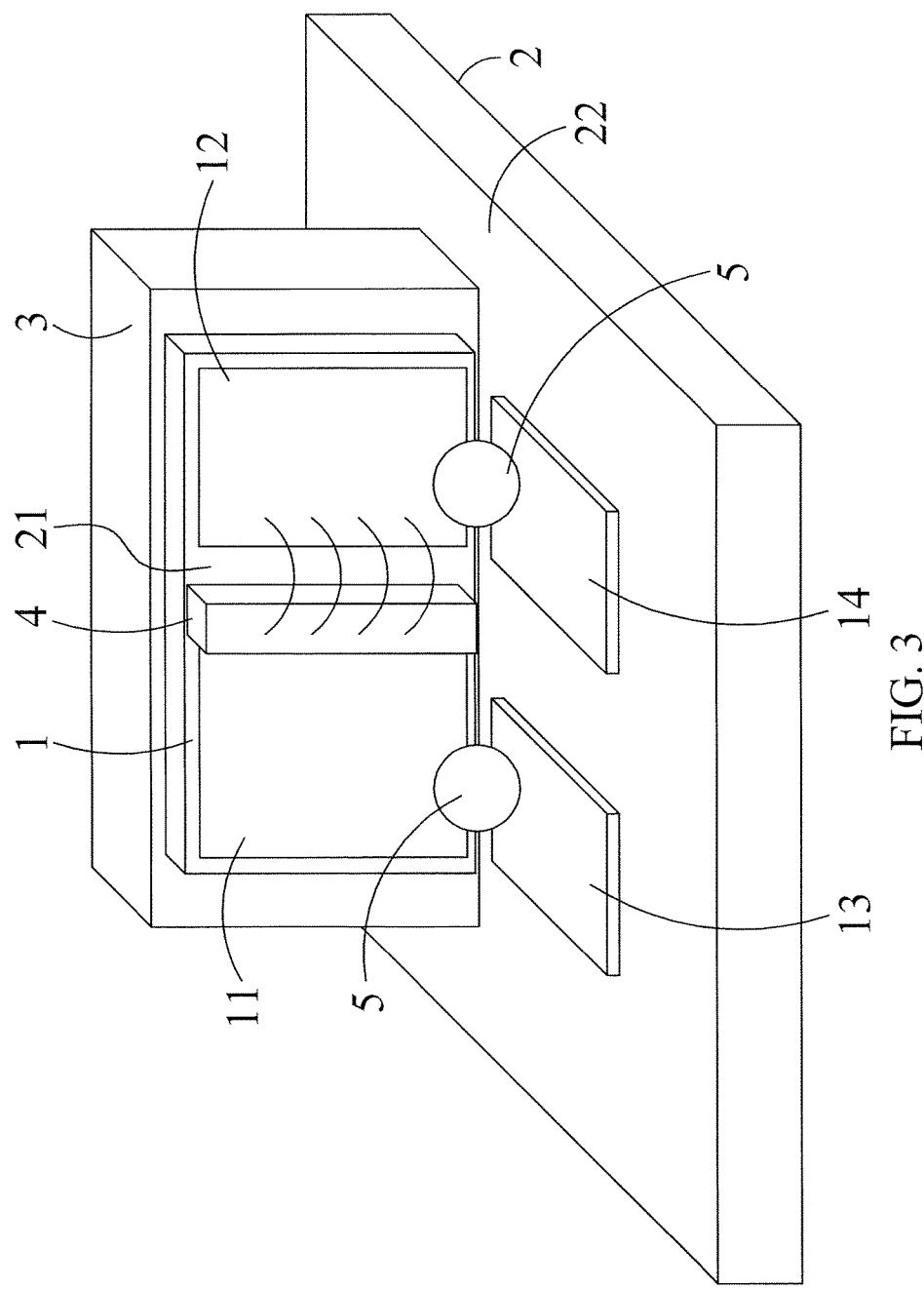
FIG. 3 is a packaging structure diagram of a laser diode in accordance with another embodiment of the present invention.

FIG. 3 is a packaging structure diagram of a laser diode in accordance with another embodiment of the present invention. Please refer to FIG. 3, the packaging structure of the laser diode includes: a laser chip 4, a first substrate 1, a second substrate 2 and a third carrier 3. The laser chip 4 may be a laser diode light-emitting element. There are a first electrode 11 and a second electrode 12 on a first surface 21 of the first substrate 1, and the laser chip 4 is disposed on the first surface 21 of the first substrate 1. The laser chip 4 may be electrically connected to the second electrode 12 of the first carrier 1 by silver paste, solder or the only once wire bonding. In addition, there are a third electrode 13 and a fourth electrode 14 on a second surface 22 of the second substrate 2, and the first carrier 1 is disposed on the second surface 22 of the second carrier 2. Moreover, the third carrier is disposed on a fifth surface 25 of the first carrier 1 for supporting the first carrier 1. Specifically, the first surface 21 is opposite to the fifth surface 25. The first electrode 11 and the second electrode 12 are electrically connected to the third electrode 13 and the fourth electrode 14 by a wireless-bonding process, respectively. For example, the first electrode 11 and the second electrode 12 are directly electrically connected to the third electrode 13 and the fourth electrode 14 by silver paste 5, respectively, or the first electrode 11 and the second electrode 12 are directly electrically connected to the third electrode 13 and the fourth electrode 14 by solder 5, respectively. Specifically, the electrodes of the present invention are made of conductive metallic materials, such as copper, nickel, gold, silver, or other alloys, and the substrates of the present invention are made of insulation materials, such as resin, glass or ceramic.

In the above, the electrodes are electrically connected to each other by silver paste or solder 5, so that the first electrode 11 and the second electrode 12 of the first surface 21 of the first substrate 1 are respectively electrically connected to the third electrode 13 and the fourth electrode 14 of the second surface 22 of the second carrier 2 by the wireless-bonding process, which is without disconnection doubts, effectively improving the component reliability and reducing the packaging space.

Figure 4:
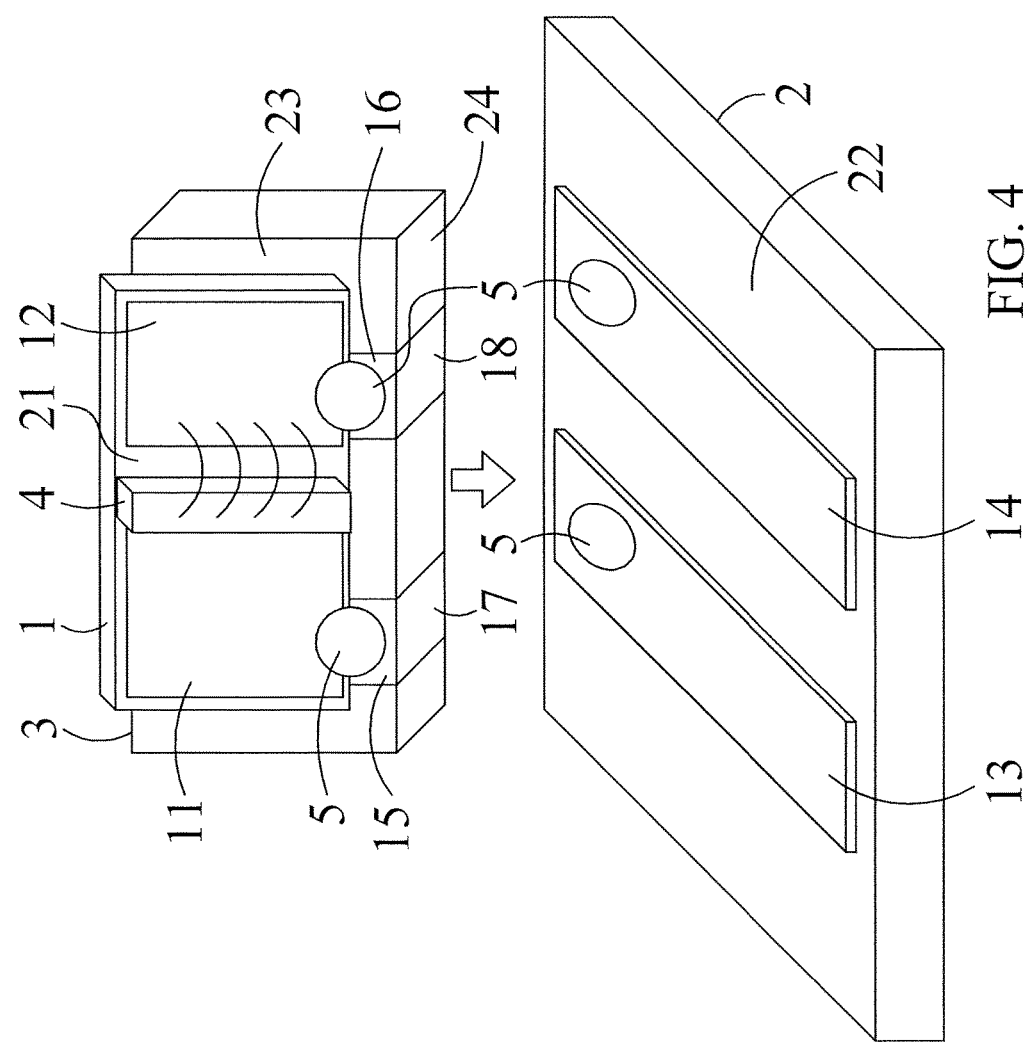
FIG. 4 is a packaging structure diagram of a laser diode in accordance with another embodiment of the present invention.

FIG. 4 is a packaging structure diagram of a laser diode in accordance with another embodiment of the present invention. Please refer to FIG. 4, the packaging structure of the laser diode includes: a laser chip 4, a first substrate 1, a second substrate 2 and a third carrier 3. The laser chip 4 may be a laser diode light-emitting element. There are a first electrode 11 and a second electrode 12 on a first surface 21 of the first substrate 1, and the laser chip 4 is disposed on the first surface 21 of the first substrate 1. The laser chip 4 may be electrically connected to the second electrode 12 of the first carrier 1 by silver paste, solder or the only once wire bonding. In addition, there are a third electrode 13 and a fourth electrode 14 on a second surface 22 of the second substrate 2, and the first carrier 1 is disposed on the second surface 22 of the second carrier 2. Moreover, there are a fifth electrode 15 and a sixth electrode 16 on a third surface 23 of the third carrier 3, and there are a seventh electrode 17 and an eighth electrode 18 on a fourth surface 24 of the third carrier 3, wherein the fifth electrode 15 and the sixth electrode 16 are electrically connected to the seventh electrode 17 and the eighth electrode 18, respectively. For example, the fifth electrode 15 and the seventh electrode 17 are integrally formed an L-shaped electrode, and the sixth electrode 16 and the eighth electrode 18 are integrally formed an L-shaped electrode, but not limited to this. The first electrode 11 and the second electrode 12 of the first carrier 1 are directly electrically connected to the fifth electrode 15 and the sixth electrode 16 by silver paste or solder, respectively, and the seventh electrode 17 and the eighth electrode 18 are directly electrically connected to the third electrode 13 and the fourth electrode 14 by silver paste or solder, respectively. Therefore, the first electrode 11 and the second electrode 12 are electrically connected to the third electrode 13 and the fourth electrode 14 by a wireless-bonding process, respectively. Specifically, the electrodes of the present invention are made of conductive metallic materials, such as copper, nickel, gold, silver, or other alloys, and the substrates of the present invention are made of insulation materials, such as resin, glass or ceramic.

In the above, the electrodes are electrically connected to each other by silver paste or solder 5, so that the first electrode 11 and the second electrode 12 of the first surface 21 of the first substrate 1 are respectively electrically connected to the third electrode 13 and the fourth electrode 14 of the second surface 22 of the second carrier 2 by the wireless-bonding process, which is without disconnection doubts, effectively improving the component reliability and reducing the packaging space.

Figure 5:
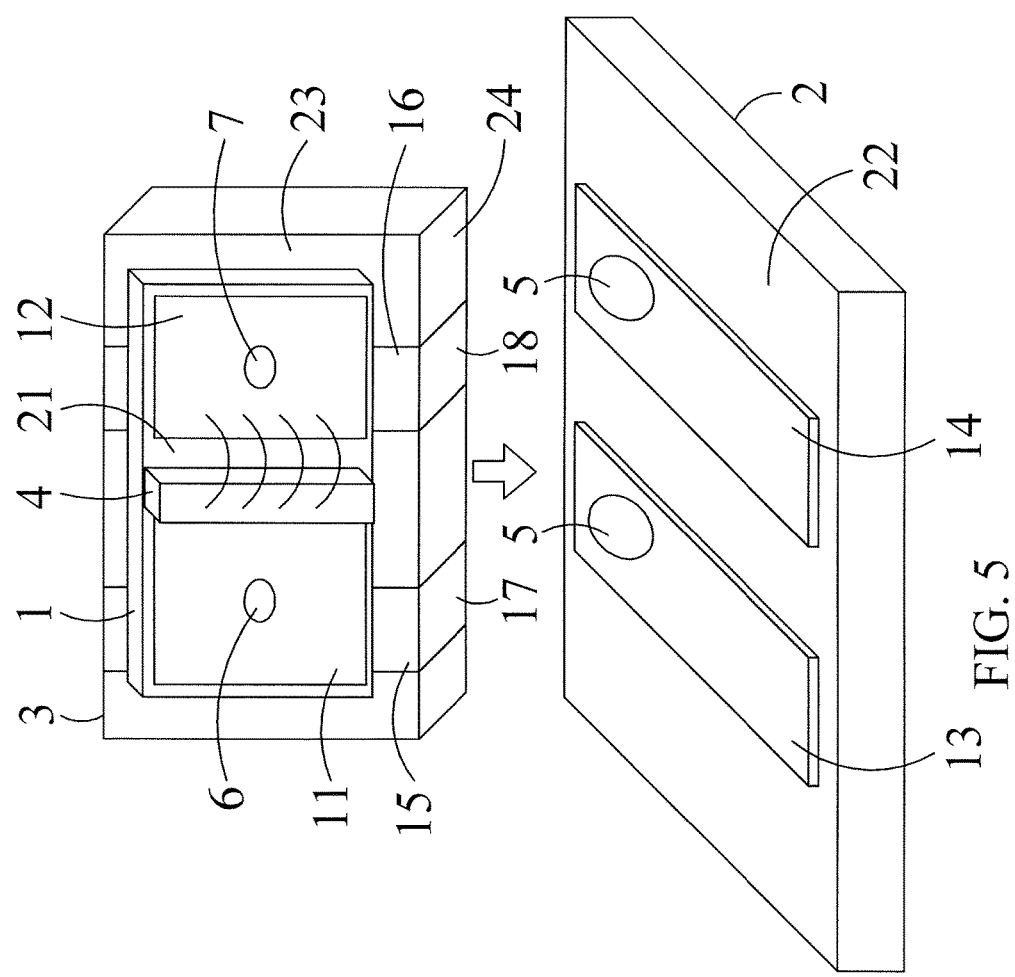
FIG. 5 is a packaging structure diagram of a laser diode in accordance with another embodiment of the present invention.
Figure 6:
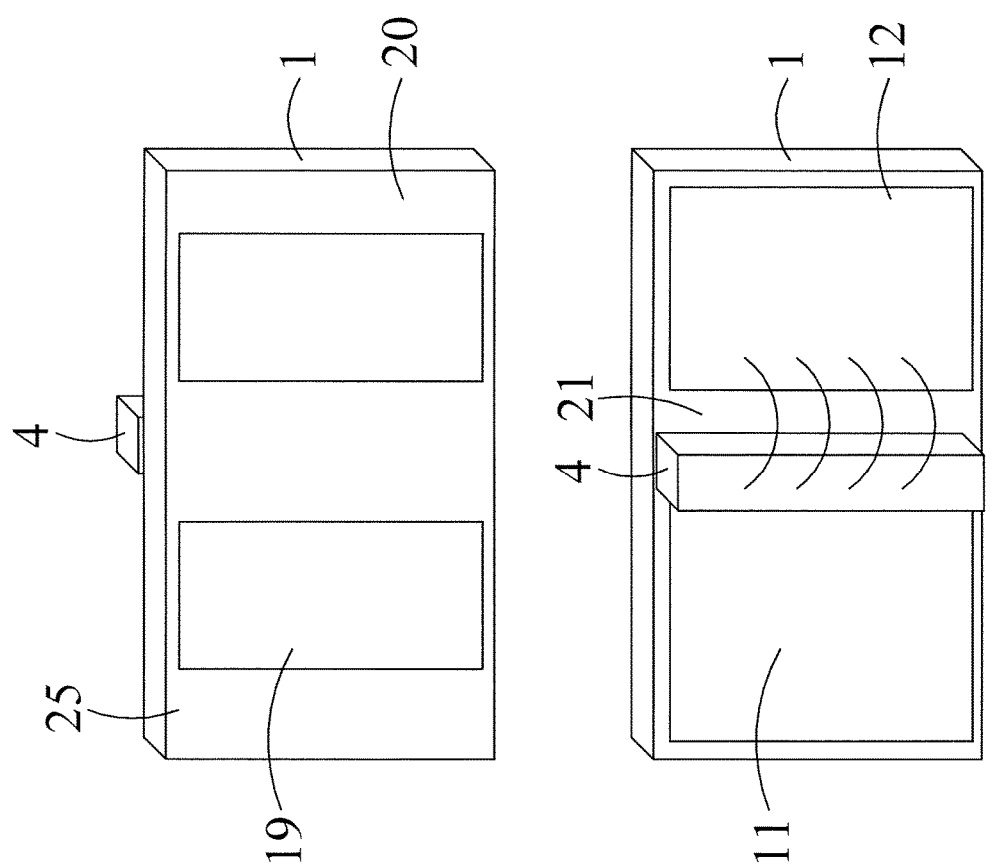
FIG. 6 is a structure diagram of a first substrate in accordance with another embodiment of the present invention.

FIG. 5 is a packaging structure diagram of a laser diode in accordance with another embodiment of the present invention, and FIG. 6 is a structure diagram of a first substrate in accordance with another embodiment of the present invention. Please refer to FIG. 5 and FIG. 6, the packaging structure of the laser diode includes: a laser chip 4, a first substrate 1, a second substrate 2 and a third carrier 3. The laser chip 4 may be a laser diode light-emitting element. There are a first electrode 11 and a second electrode 12 on a first surface 21 of the first substrate 1, and the laser chip 4 is disposed on the first surface 21 of the first substrate 1. The laser chip 4 may be electrically connected to the second electrode 12 of the first carrier 1 by silver paste, solder or the only once wire bonding. In addition, there are a third electrode 13 and a fourth electrode 14 on a second surface 22 of the second substrate 2, and the first carrier 1 is disposed on the second surface 22 of the second carrier 2. Moreover, there are a fifth electrode 15 and a sixth electrode 16 on a third surface 23 of the third carrier 3, and there are a seventh electrode 17 and an eighth electrode 18 on a fourth surface 24 of the third carrier 3, wherein the fifth electrode 15 and the sixth electrode 16 are electrically connected to the seventh electrode 17 and the eighth electrode 18, respectively. For example, the fifth electrode 15 and the seventh electrode 17 are integrally formed an L-shaped electrode, and the sixth electrode 16 and the eighth electrode 18 are integrally formed an L-shaped electrode, but not limited to this. Furthermore, there are a ninth electrode 19 and a tenth electrode 20 on a fifth surface 25 of the first carrier 1, and the first surface 21 is opposite to the fifth surface 25. The first electrode 11 and the second electrode 12 are directly electrically connected to the ninth electrode 19 and the tenth electrode 20 through holes, respectively. Specifically, each of the holes is filled with a conductive material. The ninth electrode 19 and the tenth electrode 20 of the first carrier 1 are directly electrically connected to the fifth electrode 15 and the sixth electrode 16 of the third carrier 3 by silver paste or solder, respectively, and the seventh electrode 17 and the eighth electrode 18 of the third carrier 3 are directly electrically connected to the third electrode 13 and the fourth electrode 14 of the second carrier 2 by silver paste or solder, respectively. Therefore, the first electrode 11 and the second electrode 12 are electrically connected to the third electrode 13 and the fourth electrode 14 by a wireless-bonding process, respectively. Specifically, the electrodes of the present invention are made of conductive metallic materials, such as copper, nickel, gold, silver, or other alloys, and the substrates of the present invention are made of insulation materials, such as resin, glass or ceramic.

In summary, the electrodes are electrically connected to each other by silver paste or solder 5 and holes 6, so that the first electrode 11 and the second electrode 12 of the first surface 21 of the first substrate 1 are respectively electrically connected to the third electrode 13 and the fourth electrode 14 of the second surface 22 of the second carrier 2 by the wireless-bonding process, which is without disconnection doubts, effectively improving the component reliability and reducing the packaging space.

While particular embodiments of the present invention have been shown and described, it will be obvious to those skilled in the art that, based upon the teachings herein, changes and modifications may be made without departing from this invention and its broader aspects. Therefore, the appended claims are intended to encompass within their scope of all such changes and modifications as are within the true spirit and scope of the exemplary embodiment(s) of the present invention.

What is claimed is:
1. A packaging structure of a laser diode, comprising:
a laser chip;
a first substrate having a first electrode and a second electrode on a first surface of the first substrate, and the laser chip is disposed on the first surface of the first substrate; and
a second substrate having a third electrode and a fourth electrode on a second surface of the second substrate, wherein the first electrode and the second electrode are electrically connected to the third electrode and the fourth electrode by a wireless-bonding process, respectively.
2. The packaging structure of the laser diode as claimed in claim 1, wherein the first electrode and the second electrode are electrically connected to the third electrode and the fourth electrode by silver paste, respectively.
3. The packaging structure of the laser diode as claimed in claim 1, wherein the first electrode and the second electrode are electrically connected to the third electrode and the fourth electrode by solder, respectively.
4. The packaging structure of the laser diode as claimed in claim 1, further comprising a third carrier having a fifth electrode and a sixth electrode on a third surface of the third substrate and a seventh electrode and an eighth electrode on a fourth surface of the third carrier, wherein the fifth electrode and the sixth electrode are electrically connected to the seventh electrode and the eighth electrode, respectively;
wherein a ninth electrode and a tenth electrode on a fifth surface of the first substrate, and the first electrode and the second electrode are electrically connected to the ninth electrode and the tenth electrode through holes, respectively;

the ninth electrode and the tenth electrode are electrically connected to the fifth electrode and the sixth electrode by silver paste or solder, respectively; and the seventh electrode and the eighth electrode are electrically connected to the third electrode and the fourth electrode by silver paste or solder, respectively.

5. The packaging structure of the laser diode as claimed in claim 4, wherein each of the holes is filled with a conductive material.

6. The packaging structure of the laser diode as claimed in claim 4, wherein the fifth electrode and the seventh electrode are integrally formed a L-shaped electrode, and the sixth electrode and the eighth electrode are integrally formed a L-shaped electrode.

7. The packaging structure of the laser diode as claimed in claim 4, wherein the first surface is opposite to the fifth surface.

8. The packaging structure of the laser diode as claimed in claim 1, further comprising a third substrate disposed on a fifth surface of the first substrate for supporting the first carrier, wherein the first surface is opposite to the fifth surface.

9. The packaging structure of the laser diode as claimed in claim 1, further comprising a third substrate having a fifth electrode and a sixth electrode on a third surface of the third carrier and a seventh electrode and an eighth electrode on a fourth surface of the third carrier, wherein the fifth electrode and the sixth electrode are electrically connected to the seventh electrode and the eighth electrode, respectively;

wherein the first electrode and the second electrode of the first substrate are electrically connected to the fifth electrode and the sixth electrode by silver paste or solder, respectively; and the seventh electrode and the eighth electrode are electrically connected to the third electrode and the fourth electrode by silver paste or solder, respectively.

10. The packaging structure of the laser diode as claimed in claim 9, wherein the fifth electrode and the seventh electrode are integrally formed a L-shaped electrode, and the sixth electrode and the eighth electrode are integrally formed a L-shaped electrode.

* * * * *